(12) United States Patent
Shin

(10) Patent No.: US 7,338,870 B2
(45) Date of Patent: Mar. 4, 2008

(54) METHODS OF FABRICATING SEMICONDUCTOR DEVICES

(75) Inventor: Hyun Soo Shin, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/026,714

(22) Filed: Dec. 30, 2004

(65) Prior Publication Data

US 2005/0142776 A1 Jun. 30, 2005

(30) Foreign Application Priority Data

Dec. 31, 2003 (KR) .................. 10-2003-0101671

(51) Int. Cl.
*H01L 21/336* (2006.01)
(52) U.S. Cl. .............. 438/294; 438/296; 438/301; 438/304
(58) Field of Classification Search ........... 438/294, 438/296, 301, 304, 308
See application file for complete search history.

(56) References Cited

U.S. PATENT DOCUMENTS

| 6,274,420 | B1 | 8/2001 | Xiang et al. | |
| 6,420,770 | B1 | 7/2002 | Xiang et al. | |
| 6,548,844 | B1* | 4/2003 | Fukuzumi et al. | 257/296 |
| 6,696,349 | B2 | 2/2004 | Vollrath et al. | |
| 6,849,483 | B2* | 2/2005 | King | 438/177 |
| 6,974,755 | B2* | 12/2005 | Ko et al. | 438/424 |
| 2003/0045039 | A1* | 3/2003 | Shin et al. | 438/197 |
| 2004/0041216 | A1* | 3/2004 | Mori | 257/411 |

FOREIGN PATENT DOCUMENTS

| KR | 10-2002-045259 | 6/2002 |
| KR | 10 2003 002519 | 1/2003 |

\* cited by examiner

*Primary Examiner*—Hsien-Ming Lee
(74) *Attorney, Agent, or Firm*—Saliwanchik, Lloyd & Saliwanchik

(57) ABSTRACT

Methods of recovering damage on a semiconductor device by performing a hydrogen annealing process are disclosed. An example disclosed method includes forming an STI structure on a semiconductor substrate; forming a gate electrode and spacers on the sidewalls of the gate electrode; implanting ions into source and drain regions and performing a hydrogen annealing process; and performing a thermal treatment for the resulting structure to diffuse and align the ions in the source/drain region.

3 Claims, 2 Drawing Sheets

METHODS OF FABRICATING SEMICONDUCTOR DEVICES

TECHNICAL FIELD

The present disclosure relates generally to semiconductors and, more particularly, to methods of fabricating semiconductor devices.

BACKGROUND

For device isolation, a local oxidation of silicon (LOCOS) process has been widely employed. The LOCOS process forms a device isolation structure by thermally oxidizing a silicon substrate itself using a nitride layer as a mask. Therefore, the LOCOS process achieves the simplicity of a fabrication process and provides an oxide layer having high quality and a high resistance against stresses.

However, the device isolation achieved by the LOCOS process has several shortcomings such as a bird's-beak, which may be formed at the edges of the device isolation structure. Therefore, the LOCOS process increases the area of the device isolation structure and has a difficulty in the miniaturization of a semiconductor device.

Accordingly, various methods to solve such problems in the conventional LOCOS process have been suggested. One method is to form a shallow trench isolation (STI) structure as the device isolation structure. Briefly, an STI structure formation process makes a trench in a silicon substrate and fills an insulating material into the trench. Thus, the STI structure with a small area and the miniaturization of the semiconductor device are achieved.

In detail, a conventional STI structure forming process is as follows. A trench is formed in a silicon substrate by a dry etch. Subsequently, an annealing process is performed to cure etching damages inside the trench. An oxide layer is then formed by thermally oxidizing the inside of the trench so as to enhance a surface characteristic and to prevent the occurrence of problems due to the rounded sidewalls of the STI structure. Subsequently, an insulating layer is deposited inside the trench and on the entire surface of the resulting structure. A Chemical Mechanical Polishing (CMP) is then performed to planarize the surface of the resulting structure and complete gate lines.

However, in the conventional STI formation process, several problems occur due to a difference in height between a field region and a moat region. For example, as shown at reference number 101 in FIG. 1, if the level of the field region 100 is lower than that of the moat region 200, leakage current may be generated due to polysilicon residue between the field region 100 and the moat region 200. In addition, polysilicon for gate electrodes may easily penetrate into a void 102 in the STI structure, thereby causing another leakage current.

On the other hand, if the level of the field region is higher than that of the moat region, several problems may be generated as well. For example, moat pits may arise in an exposed area during a later etching process for polysilicon. Moreover, if a contact pattern is inadequately aligned, some portion of an oxide layer may be lost, resulting in leakage fails. In addition, the difference in height between the field region 100 and the moat region 200 makes it difficult to control critical dimensions during later patterning and etching processes. Additionally, the edges of a gate electrode and the field region may be damaged by the plasma etching process for forming spacers and the ion implantation process for forming source and drain regions.

DETAILED DESCRIPTION

Disclosed herein are methods of semiconductor manufacturing and, in particular, methods of recovering damages on a semiconductor device by performing a hydrogen annealing process. The devices fabricated in conjunction with this disclosure suppress the occurrence of leakage current on the edges of a gate electrode and a field region by performing a hydrogen annealing process, before and/or after ions are implanted into source and drain regions.

According to one example, a disclosed method includes forming an STI structure on a semiconductor substrate; forming a gate electrode and spacers on the sidewalls of the gate electrode; implanting ions into source and drain regions and performing a hydrogen annealing process; and performing a thermal treatment for the resulting structure to diffuse and align the ions in the source/drain region.

Figure 1:
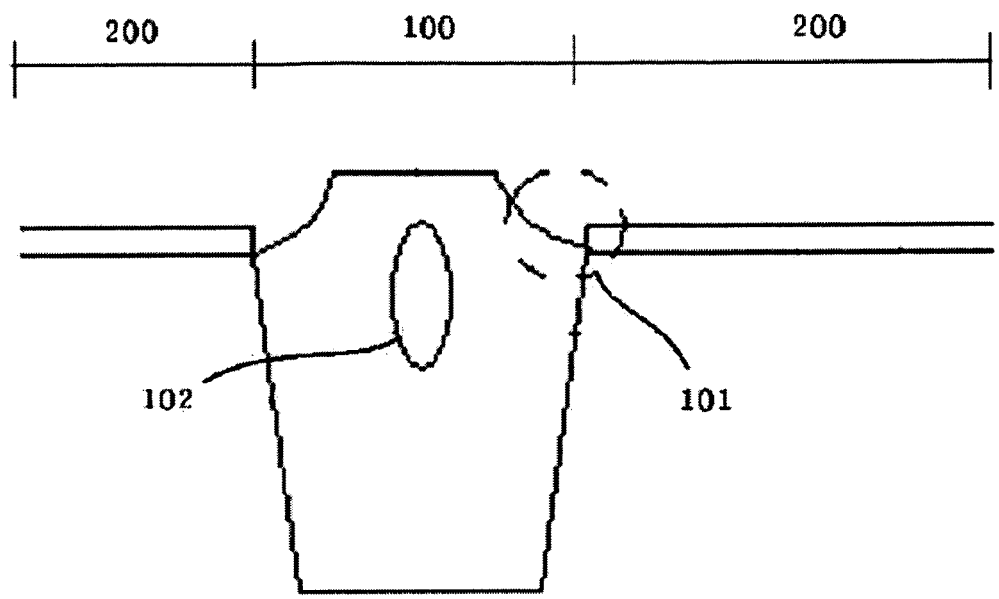
FIG. 1 is a cross-sectional view illustrating a semiconductor device fabricated according to a known manner.
Figure 2A:
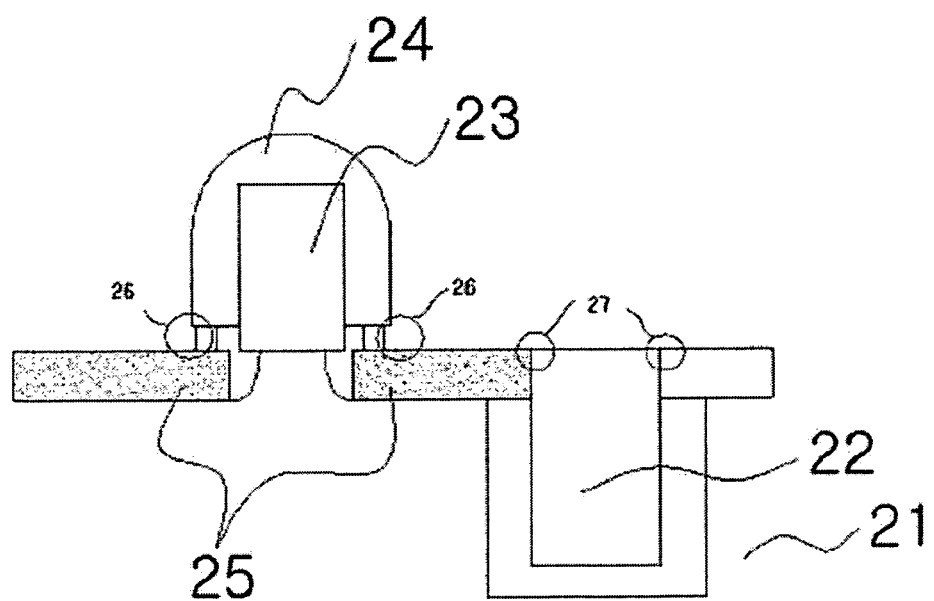
FIG. 2a is a cross-sectional view illustrating one example of a semiconductor device fabricated in accordance with the disclosure.
Figure 2B:
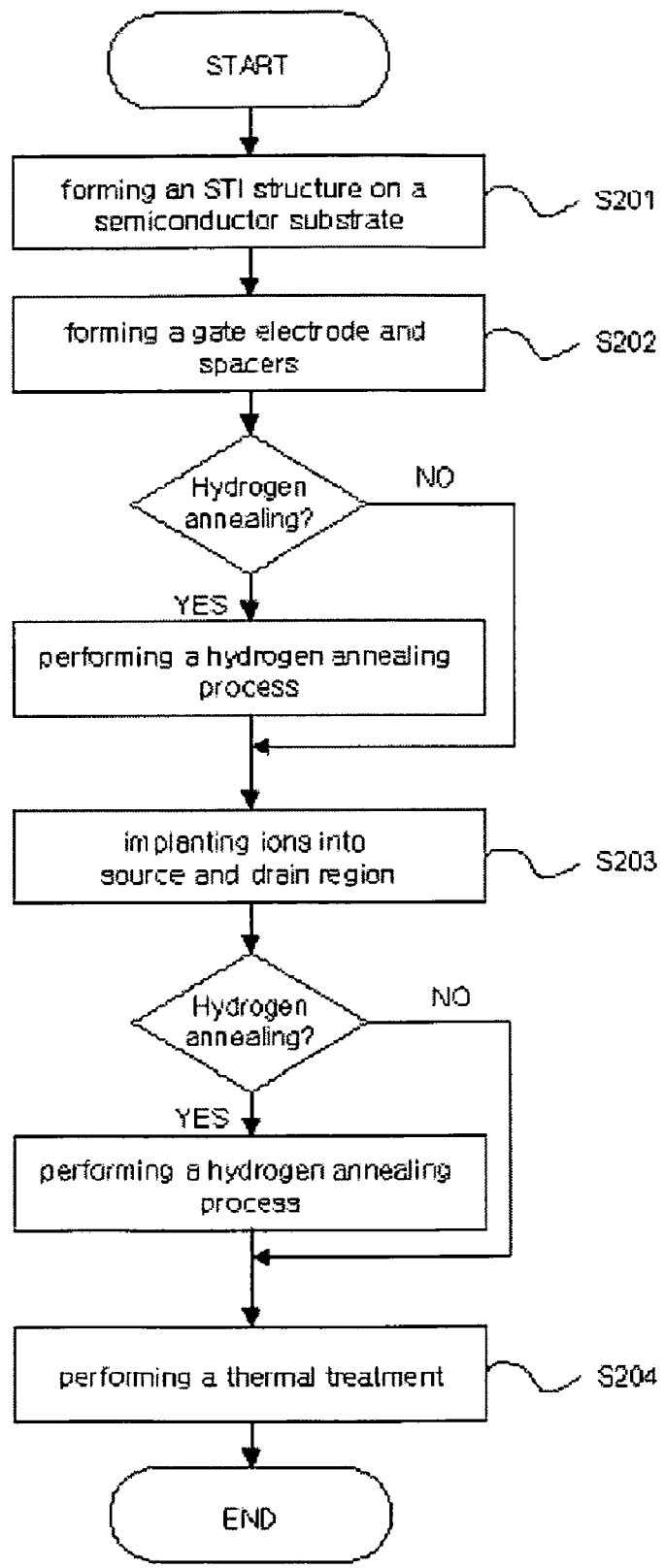
FIG. 2b is a flow-chart illustrating an example disclosed process for fabricating a semiconductor device.

Referring to FIGS. 2a and 2b, an STI structure 22 filled with an insulating material is formed in a silicon substrate 21 (S201). A gate electrode 23 and spacers 24 on the sidewalls of the gate electrode 23 are then formed (S202). Subsequently, source and drain regions 25 are formed by implanting ions (S203). A thermal treatment is then performed to diffuse and align the implanted ions in the source and drain regions 25 (S204).

In the foregoing sequence, some portion of the silicon substrate 21 is easily damaged during the plasma etching process before forming the source and drain region 25. In particular, the edges 26 of the gate electrode 23 and the edges 27 of the STI structure 22 are seriously damaged and, therefore, leakage current occurs in the resulting structure.

Accordingly, to prevent damage due to the plasma etching and the ion implantation, a hydrogen annealing process is performed before and/or after the ion implantation process for forming the source and drain region 24, thereby suppressing the occurrence of the leakage current by recovering such damages. The hydrogen annealing process may be performed at a temperature between about 600° C. and about 800° C. for about 5 seconds to about 30 seconds, and with a gas rate between about 0.1 slm and about 100 slm.

As disclosed herein, leakage currents are suppressed on the edges of a gate electrode and a field region by performing a hydrogen annealing process, before and/or after ions are implanted into source and drain regions.

It is noted that this patent claims priority from Korean Patent Application Serial Number 10-2003-0101671, which was filed on Dec. 31, 2003, and is hereby incorporated by reference in its entirety.

Although certain example methods, apparatus, and articles of manufacture have been described herein, the scope of coverage of this patent is not limited thereto. On the contrary, this patent covers all methods, apparatus, and articles of manufacture fairly falling within the scope of the appended claims either literally or under the doctrine of equivalents.

What is claimed is:

1. A method for fabricating a device isolation comprising:
   forming a shallow trench isolation structure on a semiconductor substrate;
   forming a gate electrode and spacers on the sidewalls of the gate electrode;
   implanting ions into source and drain regions;
   performing a hydrogen annealing process; and
   performing a thermal treatment for the resulting structure to diffuse and align the ions in the source/drain region,
   wherein the hydrogen annealing process is performed both before and after the implanting ions into the source and drain regions such that plasma damage to edges of the gate electrode and the edges of the STI structure is reduced.

2. The method as defined by claim 1, wherein the hydrogen annealing process is performed at a temperature between about 600° C. and about 800° C. for about 5 seconds to about 30 seconds, and with a gas rate between about 0.1 slm and about 30 slm.

3. A method for fabricating a device isolation comprising:
   forming a shallow trench isolation structure on a semiconductor substrate;
   forming a gate electrode and spacers on the sidewalls of the gate electrode;
   implanting ions into source and drain regions;
   performing a hydrogen annealing process, wherein the hydrogen annealing process is performed at a temperature between about 600° C. and about 800° C. for about 5 seconds to about 30 seconds, and with a gas rate between about 0.1 slm and about 30 slm; and
   performing a thermal treatment for the resulting structure to diffuse and align the ions in the source/drain region,
   wherein the hydrogen annealing process is performed before implanting ions into the source and drain regions such that plasma damage to edges of the gate electrode and the edges of the STI structure is reduced.

* * * * *